United States Patent
Chung et al.

(10) Patent No.: US 8,625,240 B2
(45) Date of Patent: Jan. 7, 2014

(54) INPUT/OUTPUT CIRCUIT WITH INDUCTOR

(75) Inventors: Tao Wen Chung, San Jose, CA (US);
Chan-Hong Chern, Palo Alto, CA (US);
Ming-Chieh Huang, San Jose, CA (US);
Chih-Chang Lin, San Jose, CA (US);
Yuwen Swei, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 61 days.

(21) Appl. No.: 13/293,853

(22) Filed: Nov. 10, 2011

(65) Prior Publication Data

US 2013/0120884 A1     May 16, 2013

(51) Int. Cl.
*H02H 3/22*     (2006.01)
(52) U.S. Cl.
USPC ............................................ 361/56; 361/111
(58) Field of Classification Search
USPC .................................. 361/56, 111; 330/252
See application file for complete search history.

(56) References Cited

U.S. PATENT DOCUMENTS

| | | | | |
|---|---|---|---|---|
| 6,559,693 | B2* | 5/2003 | Tung et al. | 327/115 |
| 7,215,194 | B2 | 5/2007 | Kucharski et al. | |
| 7,579,881 | B2* | 8/2009 | Bach | 327/108 |
| 2010/0253436 | A1* | 10/2010 | Kanda et al. | 330/310 |

* cited by examiner

*Primary Examiner* — Danny Nguyen
(74) *Attorney, Agent, or Firm* — Lowe Hauptman & Ham, LLP

(57) ABSTRACT

An input/output (I/O) circuit includes an electrostatic discharge (ESD) protection circuit electrically coupled with an output node of the I/O circuit. At least one inductor and at least one loading are electrically coupled in a series fashion and between the output node of the I/O circuit and a power line. A circuitry is electrically coupled with a node between the at least one inductor and the at least one loading. The circuitry is operable to increase a current flowing through the at least one inductor during a signal transition.

20 Claims, 3 Drawing Sheets

INPUT/OUTPUT CIRCUIT WITH INDUCTOR

TECHNICAL FIELD

The present disclosure relates generally to the field of semiconductor devices, and more particularly, to input/output (I/O) circuits with inductors.

BACKGROUND

As semiconductor technology develops, integrated circuits often contain devices operating at a high voltage level, and other devices operating at a low voltage level. The low voltage devices cannot tolerate a high voltage signal. Device failures happen frequently, when the low voltage devices operate with the high voltage signal. In order to protect the low voltage devices from the high voltage signals, the integrated circuit often includes an input/output (I/O) circuit as an interface between the low voltage devices and the high voltage devices. The I/O circuit allows the low voltage devices to communicate with the high voltage devices, while protecting the low voltage devices from being damaged by the high voltage signals.

BRIEF DESCRIPTION OF THE DRAWINGS

Aspects of the present disclosure may be understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
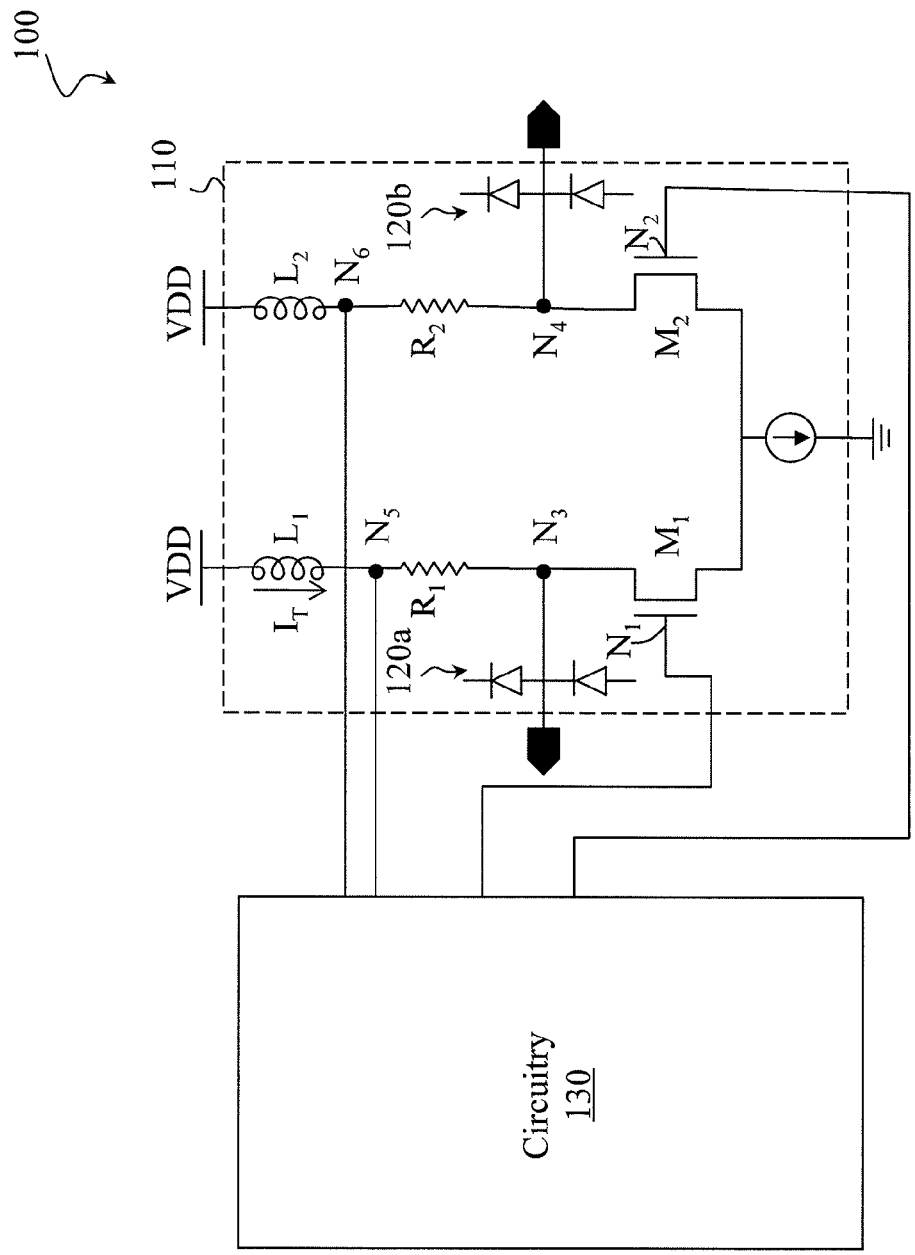
FIG. 1 is a schematic drawing of an input/output (I/O) circuit according to some embodiments.

An input/output (I/O) design has a bandwidth of about 8 gigahertz (GHz) or less. The bandwidth of this I/O design is compromised by high parasitic capacitances of electrostatic discharge (ESD) protection circuits that are added to output nodes of the I/O. In some instances, the parasitic capacitances of the ESD protection circuits are reduced. However, the parasitic capacitances cannot be reduced in designing some high bandwidth I/Os.

During designing an I/O accommodating a bandwidth of about 10 GHz or more, an inductive peaking technique uses a pair of inductors, each of which is electrically coupled between a loading resistor and a supply voltage VDD. In some instances, the inductance of the inductor may be around 0.3 nanoheneries (nH) for a design with a 40-nm technology node or smaller.

As the technology node of integrated circuits shrinks, an area available for an I/O design becomes smaller. In some embodiments, the design of the 0.3-nH inductors for inductive peaking may be too large to fit into a single I/O pitch. The large inductors and the small I/O pitch make the I/O design challenging for the small technology node.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing of an input/output (I/O) circuit. In FIG. 1, an I/O circuit 100 includes a driver stage 110 that is electrically coupled with a circuitry 130. The driver stage 110 includes at least one input node, e.g., input nodes $N_1$ and $N_2$, and at least one output node, e.g., output nodes $N_3$ and $N_4$. The input nodes $N_1$ and $N_2$ are electrically coupled with gates of transistors $M_1$ and $M_2$ of the driver stage 110, respectively. Drains of the transistors $M_1$ and $M_2$ each are electrically coupled with the respective output nodes $N_3$ and $N_4$. In FIG. 1, the output nodes $N_3$ and $N_4$ of the driver stage 110 are the output nodes of the I/O circuit 100.

In some embodiments, the driver stage 110 includes at least one electrostatic discharge (ESD) protection circuit, e.g., ESD protection circuits 120a and 120b, which are electrically coupled with the respective output nodes $N_3$ and $N_4$ of the I/O circuit 100. The ESD protection circuits 120a and 120b are configured to protect the I/O circuit 100 from being damaged by a momentary electrostatic discharge event that happens to the output nodes $N_3$ and $N_4$. In some embodiments, the ESD protection circuits 120a and 120b each have a parasitic capacitance of about 400 femtofarads (fF) or more.

Referring to FIG. 1, the I/O circuit 100 includes at least one inductor, e.g., inductors $L_1$ and $L_2$, which are electrically coupled with respective loadings, e.g., resistors $R_1$ and $R_2$ in a series fashion. The inductor $L_1$ and the resistor $R_1$ are electrically coupled between the output node $N_3$ and a power line that is configured to provide a supply voltage VDD. The inductor $L_2$ and the resistor $R_2$ are electrically coupled between the output node $N_4$ and the power line that is configured to provide a supply voltage VDD. In some embodiments, the supply voltage VDD is about 1.8 V, the inductance of each inductor is about 0.1 nanohenry (nH) or less, and the resistance of each resistor is about 50 ohm ($\Omega$). As the inductance of each inductor is low, the area used by the inductor design is small such that the inductors 120a and 120b can be designed in a single I/O pitch. In some embodiments, the I/O pitch is about 30 μm or less.

It is noted that the inductance, parasitic capacitance, supply voltage and/or resistance described above in conjunction with FIG. 1 are merely exemplary. The scope of this application is not limited thereto. In some embodiments, the inductance, parasitic capacitance, supply voltage and/or resistance may be modified in response to a change of the technology node, the bandwidth design of the I/O circuit and/or other design changes.

Referring again to FIG. 1, the circuitry 130 is operable to increase a current $I_T$ flowing through the inductor $L_1$ or $L_2$ during a signal transition. For example, a pair of signals having opposite voltage states are applied to the input nodes $N_1$ and $N_2$. The signals turn off and on the respective transistors $M_1$ and $M_2$, such that a current is flowing through the inductor $L_2$.

During the signal transition, the signal applied to the input node $N_1$ turns on the transistor $M_1$ and another signal that applied to the input node $N_2$ turns off the transistor $M_2$. As the current $I_T$ flowing through the inductor $L_1$ is increased and/or induced by the circuitry 130, a portion of the current $I_T$ flows through the resistor $R_1$ and the remaining portion of the current $I_T$ flows through the circuitry 130. Even if the inductance of the inductor $L_1$ is small, e.g., about 0.1 nH or less, the voltage differential across the inductor $L_1$ is increased due to the increase of the current $I_T$. The pull-up of the voltage level on the node $N_3$ becomes fast. By increasing the current $I_T$, not only can the bandwidth of the I/O circuit 100 be increased, but also the small inductor $L_1$ can be designed in a single I/O pitch.

Figure 2:
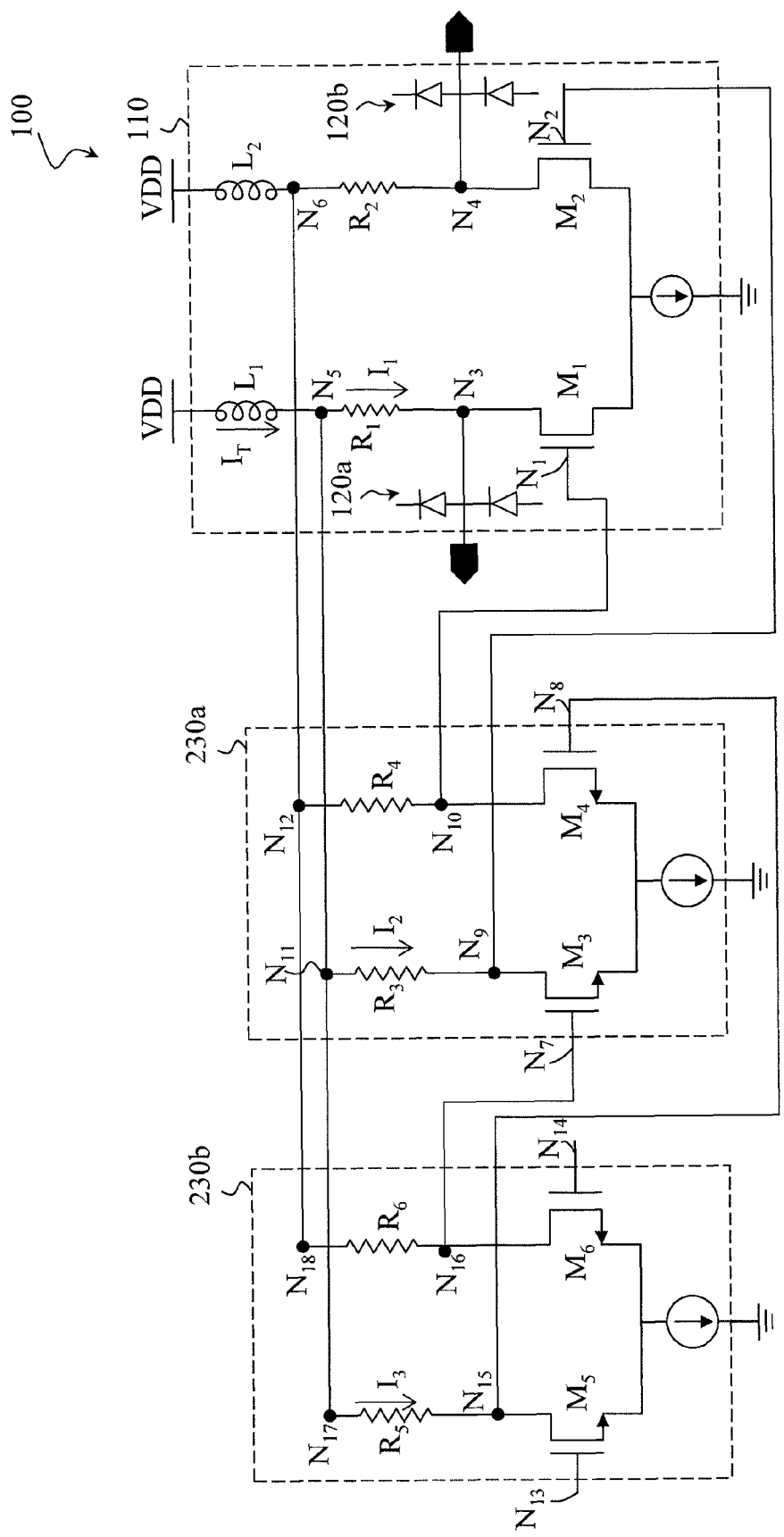
FIG. 2 is a schematic drawing illustrating an exemplary I/O circuit including at least one pre-driver stage according to some embodiments.

FIG. 2 is a schematic drawing illustrating an exemplary I/O circuit including at least one pre-driver stage. The at least one pre-driver stage is operable to generate pre-driver signals applied to the input nodes $N_1$ and $N_2$ of the driver stage 110. The at least one pre-driver stage is also operable to increase and/or induce the current $I_T$ flowing through the inductors $L_1$ and $L_2$.

In some embodiments, the circuitry 130 includes at least one pre-driver stage, e.g., pre-driver stages 230a and 230b. The pre-driver stages 230a and 230b each include respective input nodes $N_7$-$N_8$ and $N_{13}$-$N_{14}$, and respective output nodes $N_9$-$N_{10}$ and $N_{15}$-$N_{16}$. The pre-driver stages 230a and 230b each also include respective transistor pairs $M_3$-$M_4$ and $M_5$-$M_6$. Gates of the transistors $M_3$-$M_6$ each are electrically coupled with the respective input nodes $N_7$, $N_8$, $N_{13}$ and $N_{14}$. The output nodes $N_9$, $N_{10}$, $N_{15}$ and $N_{16}$ are electrically coupled with the respective input nodes $N_2$, $N_1$, $N_8$ and $N_7$.

Referring again to FIG. 2, the pre-driver stages 230a and 230b include respective resistor pairs $R_3$-$R_4$ and $R_5$-$R_6$. In some embodiments, the pre-driver stages 230a and 230b are electrically coupled with the node $N_5$ between the inductor $L_1$ and the resistor $R_1$ and the node $N_6$ between the inductor $L_2$ and the resistor $R_2$. For example, nodes $N_{11}$ and $N_{17}$ of the pre-driver stages 230a and 230b, respectively, are electrically coupled with the node $N_5$. Nodes $N_{12}$ and $N_{18}$ of the pre-driver stages 230a and 230b, respectively, are electrically coupled with the node $N_6$.

As noted, during the signal transition the current $I_T$ flowing through the inductor $L_1$ of the driver stage 110 is increased. If the nodes $N_{11}$ and $N_{17}$, and $N_{12}$ and $N_{18}$ were not electrically coupled with the respective nodes $N_5$ and $N_6$, the current $I_T$ would have been substantially equal to a current $I_1$ flowing through the resistor $R_1$. In FIG. 2, as the nodes $N_{11}$ and $N_{17}$, and $N_{12}$ and $N_{18}$ are electrically coupled with the respective nodes $N_5$ and $N_6$, the current $I_T$ is substantially equal to the sum of currents $I_1$, $I_2$ and $I_3$ that flow through the resistors $R_1$, $R_3$ and $R_5$ of the driver stage 110 and pre-driver stages 230a and 230b, respectively. In some embodiments, the currents $I_1$, $I_2$ and $I_3$ are substantially equal to each other. In some embodiments, the term "equal" here means that the currents $I_1$, $I_2$ and $I_3$ have the same frequency, phase and/or amplitude.

It is noted that the number of the pre-driver stages 230a and 230b described above in conjunction with FIG. 2 is merely exemplary. The scope of this application is not limited thereto. In some embodiments, a single pre-driver stage or more than two pre-driver stages are applied to increase and/or induce the current $I_T$. The number of the pre-driver stages may be changed in response to the design of the inductors, the differences of current phase and/or frequency of the currents flowing through the respective driver stages, and/or other design of the I/O circuit.

Figure 3:
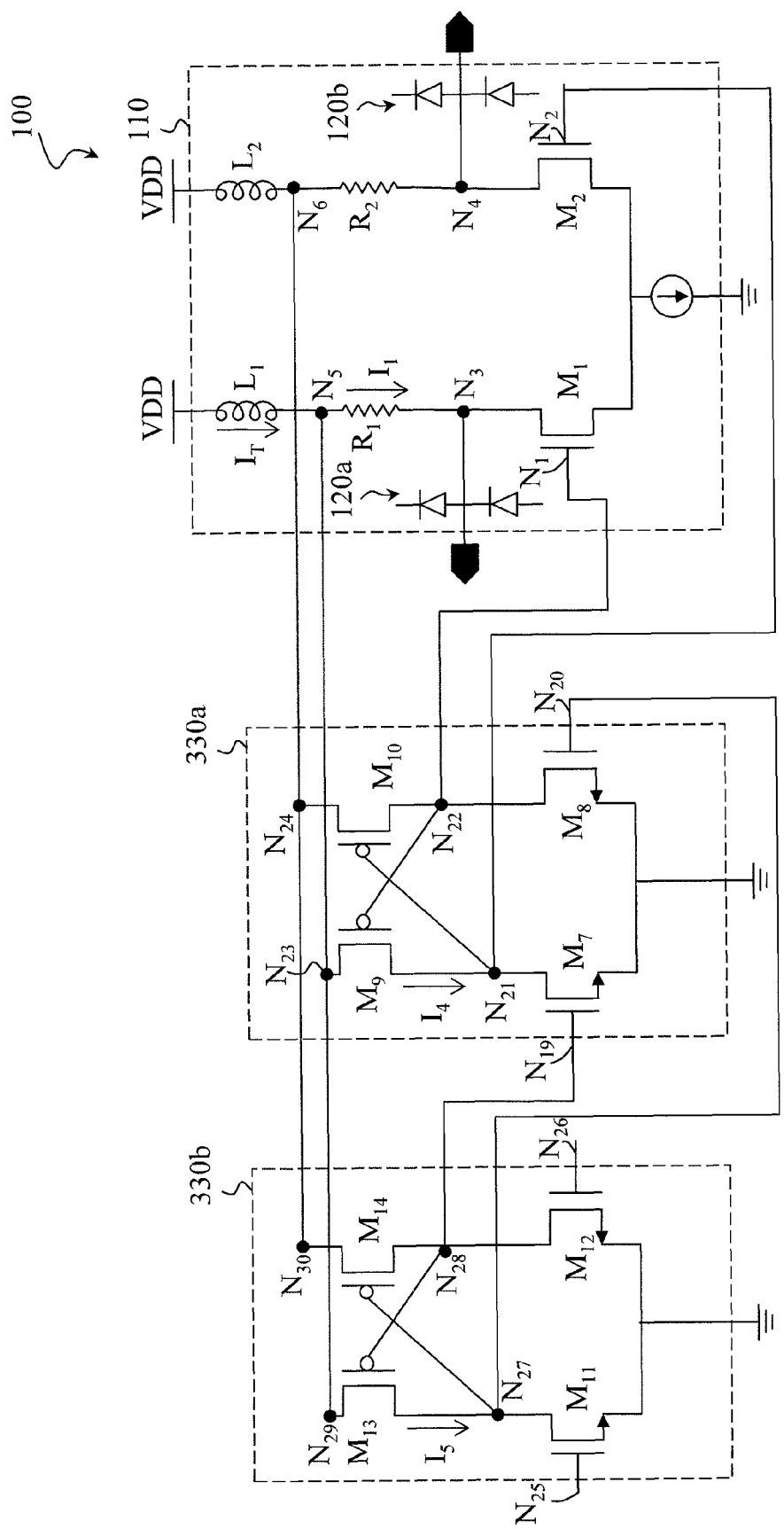
FIG. 3 is a schematic drawing illustrating an exemplary I/O circuit including at least one level shifter according to some embodiments.

FIG. 3 is a schematic drawing illustrating an exemplary I/O circuit including at least one level shifter. The at least one level shifter is operable to shift voltage stages of signals applied to the input nodes $N_1$ and $N_2$ of the driver stage 110. The at least one level shifter is also operable to increase and/or induce the current $I_T$ flowing through the inductors $L_1$ and $L_2$.

In some embodiments, the circuitry 130 includes at least one level shifter, e.g., level shifters 330a and 330b. The level shifters 330a and 330b each include respective input nodes $N_{19}$-$N_{20}$ and $N_{25}$-$N_{26}$, and respective output nodes $N_{21}$-$N_{22}$ and $N_{27}$-$N_{28}$. The level shifters 330a and 330b each also include respective transistors $M_7$-$M_{10}$ and $M_{11}$-$M_{14}$. In some embodiments, the transistors $M_7$-$M_8$ and $M_{11}$-$M_{12}$ are N-type transistors and the transistors $M_9$-$M_{10}$ and $M_{13}$-$M_{14}$ are P-type transistors. Gates of the transistors $M_7$-$M_8$ each are electrically coupled with the respective input nodes $N_{19}$ and $N_{20}$. The output nodes $N_{21}$-$N_{22}$ and $N_{27}$-$N_{28}$ are electrically coupled with the respective input nodes $N_2$, $N_1$, $N_{20}$ and $N_{19}$.

Referring to again FIG. 3, the output nodes $N_{21}$ and $N_{22}$ are disposed between the transistors $M_7$ and $M_9$ and between the transistors $M_8$ and $M_{10}$, respectively. The output nodes $N_{27}$ and $N_{28}$ are disposed between the transistors $M_{11}$ and $M_{13}$ and between the transistors $M_{12}$ and $M_{14}$, respectively. In some embodiments, the level shifters 330a and 330b are electrically coupled with the node $N_5$ between the inductor $L_1$ and the resistor $R_1$ and the node $N_6$ between the inductor $L_2$ and the resistor $R_2$. For example, nodes $N_{23}$ and $N_{29}$ are electrically coupled with the node $N_5$, and nodes $N_{24}$ and $N_{30}$ are electrically coupled with the node $N_6$.

As noted, during the signal transition the current $I_T$ flowing through in the inductor $L_1$ is increased. If the nodes $N_{23}$ and $N_{29}$ and $N_{24}$ and $N_{30}$ were not electrically coupled with the respective nodes $N_5$ and $N_6$, the current $I_T$ would have been equal to a current $I_1$ flowing through the resistor $R_1$. In FIG. 3, as the nodes $N_{23}$ and $N_{29}$, and $N_{24}$ and $N_{30}$ are electrically coupled with the respective nodes $N_5$ and $N_6$, the current $I_T$ is substantially equal to the sum of currents $I_1$, $I_4$ and $I_5$ flowing through the resistor $R_1$ and the transistors $M_9$ and $M_{13}$ of the driver stage 110 and level shifters 330a and 330b, respectively. In some embodiments, the currents $I_1$, $I_4$ and $I_5$ are substantially equal to each other. In some embodiments, the term "equal" here means that the currents $I_1$, $I_4$ and $I_5$ have the same frequency, phase and/or amplitude.

During the signal steady state, the currents flowing through the level shifters 330a and 330b are substantially equal to zero. The current $I_T$ flowing through in the inductor $L_1$ is substantially equal to the current $I_1$ that flows through the resistor $R_1$. Because no substantive current is flowing through the level shifters 330a and 330b during the signal steady state, the power consumed by the I/O circuit 100 is small.

It is noted that the number of the level shifters 330a and 330b described above in conjunction with FIG. 3 is merely exemplary. The scope of this application is not limited thereto. In some embodiments, a single level shifter or more than two level shifters are applied to increase and/or induce the current $I_T$. The number of the level shifters may be changed in response to the design of the inductors, the differences of current phase and/or frequency of the currents flowing in the respective level shifters, and/or other design of the I/O circuit.

In some embodiments, the level shifter 330a or 330b is replaced with the pre-driver stage 230a or 230b. In other embodiments, an additional driver stage is electrically coupled with the level shifters 330a and 330b in a parallel fashion to increase and/or induce the current $I_T$.

In an exemplary embodiment of this application, an input/output (I/O) circuit includes an electrostatic discharge (ESD) protection circuit electrically coupled with an output node of the I/O circuit. At least one inductor and at least one loading are electrically coupled in a series fashion and between the output node of the I/O circuit and a power line. A circuitry is electrically coupled with a node between the at least one inductor and the at least one loading. The circuitry is operable to increase a current flowing through the at least one inductor during a signal transition.

In another exemplary embodiment of this application, an input/output (I/O) circuit includes a driver stage that includes a first electrostatic discharge (ESD) protection circuit electrically coupled with a first output node of the driver stage. A second ESD protection circuit is electrically coupled with a second output node of the driver stage. A first inductor and a first resistor are electrically coupled in a series fashion and between the first output node of the driver stage and a power line. A second inductor and a second resistor are electrically coupled in a series fashion and between the second output node of the driver stage and the power line. The I/O circuit also includes a first circuit that is electrically coupled with a first node between the first inductor and the first resistor and a second node between the second inductor and the second resistor. The first circuit has a third output node and a fourth output node that are electrically coupled with a first input node and a second input node of the driver stage, respectively. A second circuit is electrically coupled with the first node between the first inductor and the first resistor and the second node between the second inductor and the second resistor. The second circuit has a fifth output node and a sixth output node that are electrically coupled with a third input node and a fourth input node of the first circuit, respectively.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An input/output (I/O) circuit comprising:
   an electrostatic discharge (ESD) protection circuit electrically coupled with an output node of the I/O circuit;
   at least one inductor and at least one loading electrically coupled in a series fashion and between the output node of the I/O circuit and a power line; and
   a circuitry electrically coupled with a node between the at least one inductor and the at least one loading, wherein the circuitry is operable to increase a current flowing through the at least one inductor during a signal transition, wherein the circuitry comprises at least one level shifter having at least one output node, and the at least one output node of the at least one level shifter is electrically coupled with at least one input node of a driver stage.

2. The I/O circuit of claim 1, wherein the circuitry comprises at least one pre-driver stage having at least one output node, and the at least one output node of the at least one pre-driver stage is electrically coupled with at least one input node of a driver stage.

3. The I/O circuit of claim 2, wherein the at least one pre-driver stage comprises:

a first pre-driver stage that is electrically coupled with the node between the at least one loading and the at least one inductor, and electrically coupled with the driver stage; and
a second pre-driver stage that is electrically coupled with the node between the at least one loading and the at least one inductor, and electrically coupled with the first pre-driver stage.

4. The I/O circuit of claim 3, wherein during the signal transition a first current flows through the driver stage, a second current flows through the first pre-driver stage, a third current flows through the second pre-driver stage, and the first, second and third currents are substantially equal to each other.

5. The I/O circuit of claim 1, wherein the at least one level shifter comprises:
   a first level shifter that is electrically coupled with the node between the at least one inductor and the at least one loading, and electrically coupled with the driver stage; and
   a second level shifter that is electrically coupled with the node between the at least one inductor and the at least one loading, and electrically coupled with the first level shifter.

6. The I/O circuit of claim 5, wherein during the signal transition a first current flows through the driver stage, a second current flows through the first level shifter, a third current flows through the second level shifter, and the first, second and third currents are substantially equal to each other.

7. The I/O circuit of claim 5, wherein during a steady state a current flowing through the first and second level shifters is substantially zero.

8. The I/O circuit of claim 7, wherein the ESD protection circuit has a parasitic capacitance of about 400 femtofarads (fF) or more, and the at least one inductor has an inductance of about 0.1 nanohenry (nH) or less.

9. An input/output (I/O) circuit comprising:
   a driver stage comprising:
      a first electrostatic discharge (ESD) protection circuit electrically coupled with a first output node of the driver stage;
      a second ESD protection circuit electrically coupled with a second output node of the driver stage;
      a first inductor and a first resistor electrically coupled in a series fashion and between the first output node of the driver stage and a power line; and
      a second inductor and a second resistor electrically coupled in a series fashion and between the second output node of the driver stage and the power line; and
   a first circuit electrically coupled with a first node between the first inductor and the first resistor and a second node between the second inductor and the second resistor, a first output node of the first circuit and a second output node of the first circuit are electrically coupled with a first input node and a second input node of the driver stage, respectively; and
   a second circuit electrically coupled with the first node between the first inductor and the first resistor and the second node between the second inductor and the second resistor, a first output node of the second circuit and a second output node of the second circuit are electrically coupled with a first input node of the first circuit and a second input node of the first circuit, respectively.

10. The I/O circuit of claim 9, wherein the first circuit and the second circuit comprise a pre-driver stage or a level shifter.

11. The I/O circuit of claim 9, wherein the first circuit and the second circuit each are operable to increase a current flowing through the first inductor or the second inductor during a signal transition.

12. The I/O circuit of claim 9, wherein during the signal transition a first current flows through the driver stage, a second current flows through the first circuit, a third current flows through the second circuit, and the first, second and third currents are substantially equal to each other.

13. The I/O circuit of claim 9, wherein during a steady state a current flowing through the first and second circuits is substantially zero.

14. The I/O circuit of claim 9, wherein the first and second ESD protection circuits each have a parasitic capacitance of about 400 femtofarads (fF) or more, and the first and second inductors each have an inductance of about 0.1 nanohenry (nH) or less.

15. An input/output (I/O) circuit comprising:
a driver stage comprising:
- a first electrostatic discharge (ESD) protection circuit electrically coupled with a first output node of the driver stage;
- a second ESD protection circuit electrically coupled with a second output node of the driver stage;
- a first inductor and a first resistor electrically coupled in a series fashion and between the first output node of the driver stage and a power line; and
- a second inductor and a second resistor electrically coupled in a series fashion and between the second output node of the driver stage and the power line; and
a first level shifter electrically coupled with a first node between the first inductor and the first resistor and a second node between the second inductor and the second resistor, a first output node of the first level shifter and a second output node of the first level shifter are electrically coupled with a first input node and a second input node of the driver stage, respectively, wherein during a signal transition the first level shifter is operable to increase a current flowing through the first or second inductor; and
a second level shifter electrically coupled with the first node between the first inductor and the first resistor and the second node between the second inductor and the second resistor, a first output node of the second level shifter and a second output node of the second level shifter are electrically coupled with a first input node of the first level shifter and a second input node of the first level shifter, respectively, wherein during the signal transition the second level shifter is operable to increase a current flowing through the first or second inductor.

16. The I/O circuit of claim 15, wherein during the signal transition a first current flows through the driver stage, a second current flows through the first level shifter, a third current flows through the second level shifter, and the first, second and third currents are substantially equal to each other.

17. The I/O circuit of claim 15, wherein the first and second ESD protection circuits each have a parasitic capacitance of about 400 femtofarads (fF) or more, and the first and second inductors each have an inductance of about 0.1 nanohenry (nH) or less.

18. The I/O circuit of claim 15, wherein during a steady state a current flowing through the first and second level shifters is substantially zero.

19. The I/O circuit of claim 1, wherein the at least one inductor is designed in a single I/O pitch.

20. The I/O circuit of claim 19, wherein the I/O pitch is about 30 microns (μm) or less.

* * * * *